(12) United States Patent
Seo et al.

(10) Patent No.: US 9,012,971 B2
(45) Date of Patent: Apr. 21, 2015

(54) SEMICONDUCTOR DEVICE AND METHOD OF MANUFACTURING THE SAME

(71) Applicants: SK Hynix Inc., Gyeonggi-do (KR); Tohoku University, Miyagi-ken (JP)

(72) Inventors: Moon Sik Seo, Sendai (JP); Tetsuo Endoh, Sendai (JP)

(73) Assignees: SK Hynix Inc., Icheon (KR); Tohoku University, Sendai (JP)

( * ) Notice: Subject to any disclaimer, the term of this patent is extended or adjusted under 35 U.S.C. 154(b) by 77 days.

(21) Appl. No.: 13/714,264

(22) Filed: Dec. 13, 2012

(65) Prior Publication Data

US 2014/0131785 A1    May 15, 2014

(30) Foreign Application Priority Data

Nov. 9, 2012    (JP) .................................. 2012-246969

(51) Int. Cl.
- *H01L 29/788* (2006.01)
- *H01L 29/66* (2006.01)
- *H01L 27/115* (2006.01)

(52) U.S. Cl.
CPC ...... *H01L 29/66825* (2013.01); *H01L 29/7889* (2013.01); *H01L 27/11582* (2013.01)

(58) Field of Classification Search
CPC ................. H01L 27/11582; H01L 29/66825; H01L 29/7889
See application file for complete search history.

(56) References Cited

U.S. PATENT DOCUMENTS

| | | | |
|---|---|---|---|
| 2002/0195668 A1* | 12/2002 | Endoh et al. | 257/390 |
| 2004/0036107 A1* | 2/2004 | Matsuno et al. | 257/314 |
| 2008/0296652 A1* | 12/2008 | Forbes | 257/315 |
| 2010/0120214 A1* | 5/2010 | Park et al. | 438/287 |
| 2011/0298037 A1* | 12/2011 | Choe et al. | 257/324 |
| 2012/0049268 A1* | 3/2012 | Chang et al. | 257/324 |
| 2012/0126308 A1* | 5/2012 | Kim et al. | 257/324 |
| 2013/0119452 A1* | 5/2013 | Endoh et al. | 257/316 |

FOREIGN PATENT DOCUMENTS

| | | |
|---|---|---|
| JP | 2003-007866 A | 1/2003 |
| KR | 10-2011-0130916 A | 12/2011 |
| KR | 10-2011-0132817 A | 12/2011 |
| WO | WO 2011-142458 A1 | 11/2011 |

OTHER PUBLICATIONS

Moon-Sik Seo et al., "Highly Scalable 3-D Vertical FG NAND Cell Arrays Using the Sidewall Control Pillar (SCP)", 2012 4th IEEE International Memory Workshop, May 2012, IEEE.

* cited by examiner

*Primary Examiner* — Long K Tran
*Assistant Examiner* — Jordan Klein

(57) ABSTRACT

A semiconductor device includes a channel layer protruding from a substrate and having protrusions extending from a sidewall thereof. Floating gates surrounding the channel layer are provided between the protrusions. Control gates surrounding the floating gates are stacked along the channel layer. Interlayer insulating layers are interposed between the control gates stacked along the channel layer. A level difference exists between a lateral surface of each of the floating gates, and a lateral surface of each of the protrusions.

13 Claims, 10 Drawing Sheets

SEMICONDUCTOR DEVICE AND METHOD OF MANUFACTURING THE SAME

CROSS-REFERENCE TO RELATED APPLICATION

The present application claims priority to Japanese patent application number 2012-246969 filed on Nov. 9, 2012, in the Japan Patent Office, the entire disclosure of which is incorporated by reference herein.

BACKGROUND

1. Field of Invention

Various embodiments relate generally to a semiconductor device and a method of manufacturing the same and, more particularly, to a three-dimensional non-volatile memory device including floating gates and a method of manufacturing the same.

2. Description of Related Art

A non-volatile memory device retains data stored therein even when not powered. Two-dimensional memory devices in which memory cells are fabricated in a single layer over a silicon substrate have approached physical limits in increasing their degree of integration. Accordingly, three-dimensional (3D) non-volatile memory devices in which memory cells are stacked in a vertical direction over a silicon substrate, have been proposed. However, as for a 3D non-volatile memory device in which floating gates are stacked, characteristics of the 3D non-volatile memory device may be deteriorated due to interference between the stacked floating gates.

SUMMARY

An embodiment relates to a semiconductor device appropriate for reducing interference between stacked floating gates and a method of manufacturing the same.

A semiconductor device according to an embodiment includes a channel layer protruding from a substrate and having protrusions extending from a sidewall thereof; floating gates surrounding the channel layer and provided between the protrusions; control gates surrounding the floating gates and stacked along the channel layer; and interlayer insulating layers interposed between the control gates stacked along the channel layer, wherein a level difference exists between a lateral surface of each of the floating gates and a lateral surface of each of the protrusions.

A method of manufacturing a semiconductor device according to another embodiment includes alternately forming first material layers and second material layers; forming channel holes by etching the first material layers and the second material layers; forming first recessed regions by etching the first material layers exposed to inner walls of the channel holes by a first thickness; forming floating gates in the first recessed regions; forming second recessed regions by etching the second material layers exposed to the inner walls of the channel holes by a second thickness; and forming a channel layer having protrusions in the channel holes having the second recessed regions therein.

DESCRIPTION OF EMBODIMENTS

Figure 1:
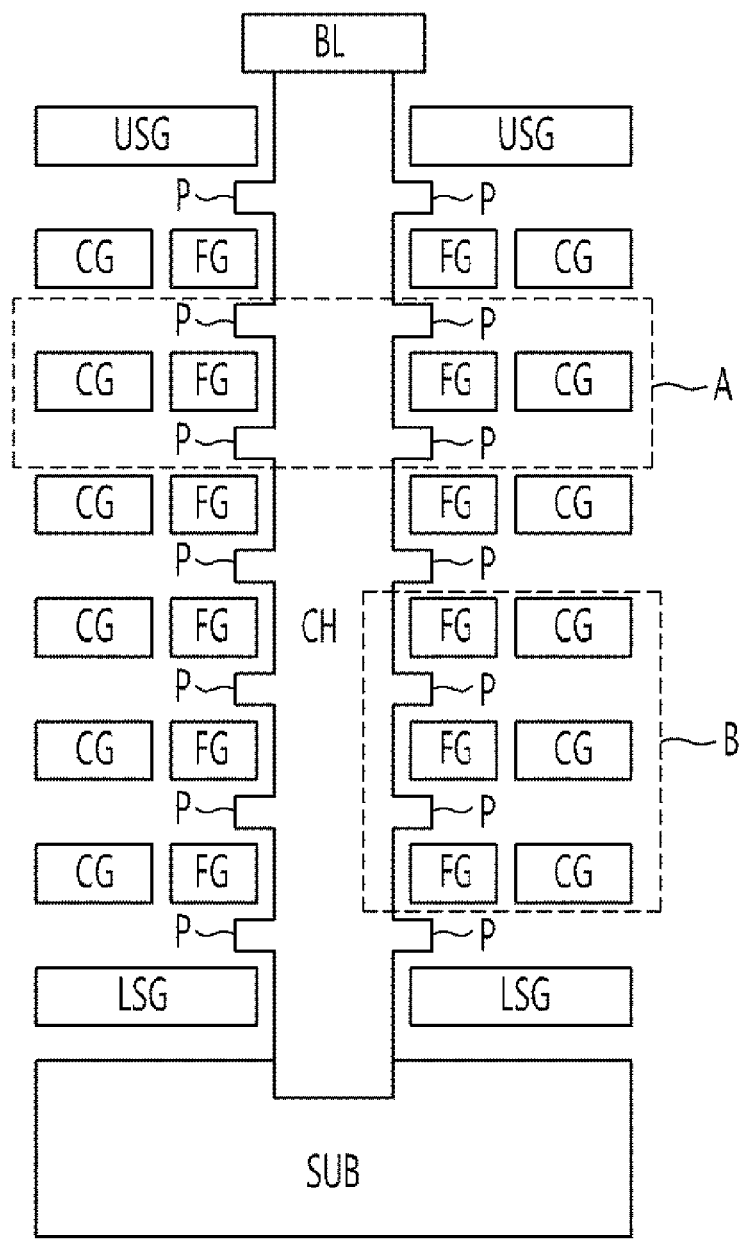
FIG. 1 is a view of a structure of a semiconductor device according to an embodiment of the present invention.

Hereinafter, various embodiments of the present invention will be described with reference to the accompanying drawings. In the drawings, a thicknesses and a distance of components are exaggerated compared to an actual physical thickness and interval for convenience of illustration. In the following description, detailed explanation of known related functions and constitutions may be omitted to avoid unnecessarily obscuring subject manner. Like reference numerals refer to like elements throughout the specification and drawings.

Figure 2A:
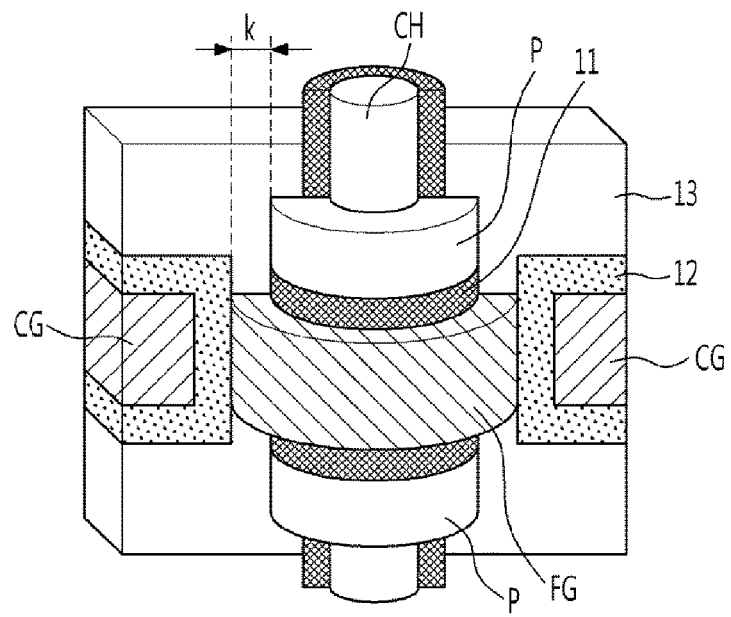
FIGS. 2A and 2B are views of a structure of a semiconductor device according to an embodiment of the present invention.
Figure 2B:
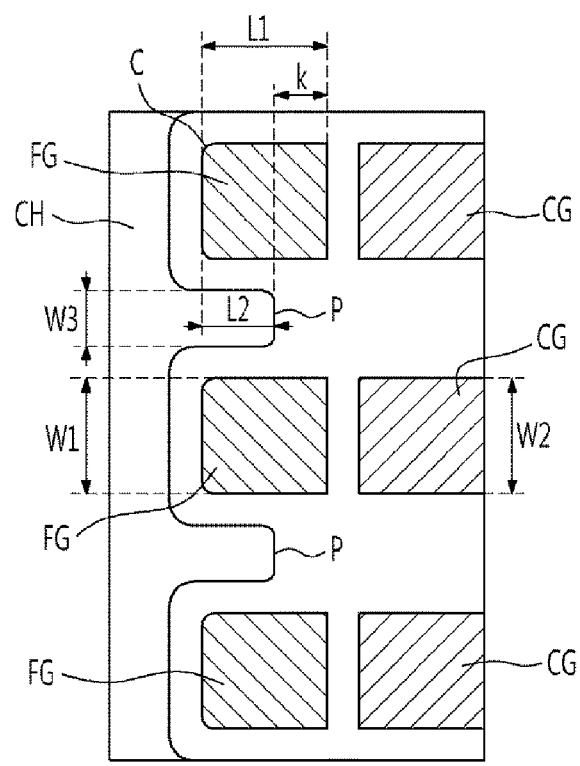

FIGS. 1 and 2A-2B are views illustrating a structure of a semiconductor device according to an embodiment of the present invention, and especially a structure of a three-dimensional (3D) non-volatile memory device including floating gates.

FIG. 1 is a cross-sectional view of a semiconductor device according to an embodiment of the present invention. In FIG. 1, insulating layers are not depicted for illustration purposes. As shown in FIG. 1, the semiconductor device includes a channel layer CH, floating gates FG stacked while surrounding the channel layer CH, and control gates CG stacked while surrounding the floating gates FG.

The channel layer CH includes a pillar protruding from a substrate SUB and protrusions P protruding from a sidewall of the pillar. The semiconductor device supplies a predetermined bias to the channel layer CH during a program, read, or erase operation. The predetermined bias is transferred to the protrusions P through the pillar. Therefore, the protrusions P have substantially the same potential as the pillar, thereby reducing interference between the floating gates FG. In other words, the protrusions P protruding between the floating gates FG serve as a barrier that blocks interference between the floating gates FG.

The protrusions P may have an annular shape encircling the sidewall of the pillar and protruding from the pillar. In addition, the channel layer CH may have the interior filled, or have an open central area filled with an insulating layer. Alternatively, the protrusions P may be solid, and the pillar may have an open central cavity filled with an insulating layer.

The floating gates FG are formed between the protrusions P and surrounding the channel layer CH with a tunnel insulating layer 11 interposed therebetween. Thus, the protrusion P is disposed between every two floating gates FG stacked in a longitudinal direction. The floating gates FG may comprise a polysilicon layer doped with impurities. In addition, each of the floating gates FG may have a length L1 (see FIG. 2B) of about 30 nm or less in order to reduce channel capacitance.

In addition, portions C of corner of each floating gate FG may be pointed or rounded with a predetermined radius of curvature. When the portions C of the corners of the floating gate FG are rounded, the portions C of the corners of the floating gate FG may have a radius of curvature of about 0.001 μm or more.

The control gates CG are stacked along the channel layer CH while surrounding the floating gates FG with a charge blocking layer 12 interposed therebetween. For example, the control gates CG may comprise a metal layer such as a tungsten layer.

As illustrated in FIG. 1, the semiconductor device may further include at least one lower select gate LSG, at least one upper select gate USG, and a bit line BL. The lower select gate LSG is formed between the substrate SUB, and the lowermost floating gate FG and the lowermost control gate CG. The upper select gate USG is formed on top of the uppermost floating gate FG and the uppermost control gate CG. The bit line BL is coupled to the channel layer CH. In addition, though not illustrated in FIG. 1, the semiconductor device may further include a source region that is formed in the substrate SUB or on the substrate SUB and is coupled to the channel layer CH. According to this structure, strings are arranged in a vertical direction relative to the substrate SUB.

Alternatively, the strings may be arranged in a U shape on the substrate SUB. Here, at least one drain select line and at least one source select line are formed on top of the uppermost control gate CG. A pipe gate may be formed on the substrate SUB, so that the pipe gate may couple drain side memory cells and source side memory cells to each other.

FIG. 2A is a perspective view of a cell structure of a semiconductor device according to an embodiment of the present invention. FIG. 2A is an enlarged cross-sectional view of a portion A of FIG. 1.

As shown in FIG. 2A, the channel layer CH includes the plurality of protrusions P spaced apart by a predetermined distance along the sidewall thereof. The protrusions P protrude from the sidewall of the channel layer CH, and have an annular shape encircling the channel layer CH. The protrusions P may be formed integrally with the channel layer CH and comprise the same, or different materials from the material used to form the channel layer CH.

Each of the floating gates FG has an annular shape surrounding the channel layer CH between the protrusions P. The tunnel insulating layer 11 is interposed between the channel layer CH and the floating gate FG. The tunnel insulating layer 11 surrounds the sidewall of the channel layer CH including the protrusions P.

The control gate CG has an annular shape surrounding the floating gate FG. The charge blocking layer 12 is interposed between the floating gate FG and the control gate CG. The charge blocking layer 12 may have a "U" shape so as to further surround the top and bottom surfaces of the control gate CG. In addition, interlayer insulating layers 13 are interposed between the control gates CG, so that the control gates CG of the stacked memory cells may be electrically insulated from each other by the interlayer insulating layers 13. The floating gates FG and the control gates CG may include at least one of a polycrystalline polysilicon layer, a metal layer, a silicide layer, a carbon nanotube and graphene.

FIG. 2B is a cross-sectional view of a cell structure of a semiconductor device according to an embodiment of the present invention. FIG. 2B is an enlarged cross-sectional view of a portion B of FIG. 1.

As shown in FIG. 2B, there is a level difference k between a lateral surface of each floating gate FG and a lateral surface of each protrusion P. The lateral surface of the floating gate FG may protrude further than that of the protrusion P.

A length L2 of the protrusion P that overlaps with the floating gate FG may be between about 20 to 90 percent of a length L1 of the floating gate FG. A length of the protrusion P overlapping with the floating gate FG is hereinafter referred to as the length L2 of the protrusion P.

A thickness W1 of the floating gate FG and a thickness W2 of the control gate CG may be substantially the same as each other (W1=W2) or be different from each other. For example, the thickness W1 of the floating gate FG may be greater than the thickness W2 of the control gate CG (W1>W2), or the thickness W2 of the control gate CG may be greater than the thickness W1 of the floating gate FG (W1<W2).

Figure 3A:
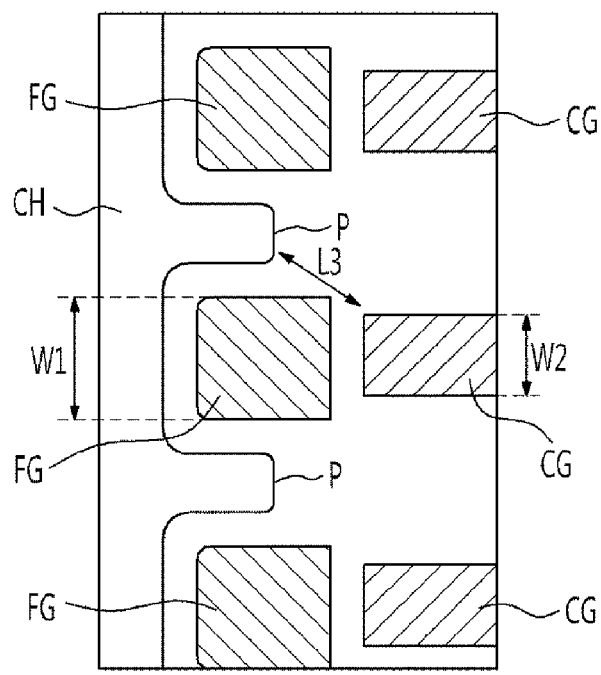
FIGS. 3A and 3B are cross-sectional views of a cell structure of a semiconductor device according to an embodiment of the present invention.
Figure 3B:
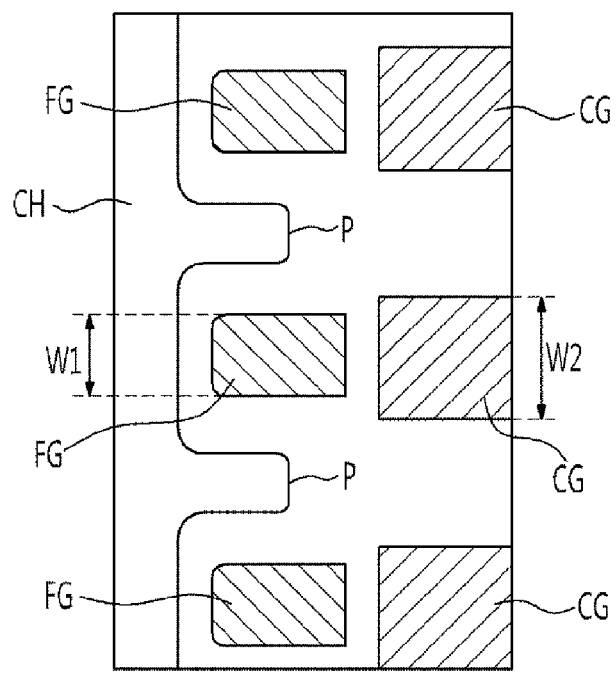

FIGS. 3A and 3B are cross-sectional views of a cell structure of a semiconductor device according to another embodiment of the present invention. As shown in FIG. 3A, the thickness W1 of the floating gate FG may be greater than the thickness W2 of the control gate CG (W1>W2). In this case, a distance L3 between each protrusion P of the channel layer CH and the control gate CG may be increased. Accordingly, the characteristics of the memory device may be improved by increasing a breakdown voltage.

As shown in FIG. 3B, the thickness W2 of the control gates CG may be greater than the thickness W1 of the floating gates FG (W1<W2). In this case, a coupling ratio of the control gate CG may be increased to increase program and erase speeds of the memory device.

Figure 4A:
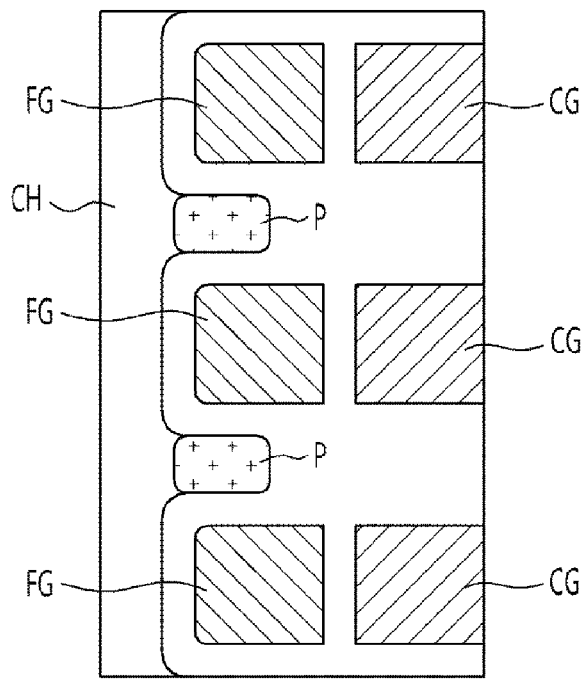
FIGS. 4A and 4B are cross-sectional views of a cell structure of a semiconductor device according to another embodiment of the present invention.

FIG. 4A is a cross-sectional view of a cell structure of a semiconductor device according to an embodiment of the present invention. As shown in FIG. 4A, the protrusions P may include the same, or different materials from the material used to form the pillar of the channel layer CH. Alternatively, the protrusions P and the channel layer CH may include the same material as each other while the protrusions P may be doped with impurities. For example, each protrusion P may include a conductive layer such as a metal layer, and the channel layer CH may comprise a semiconductor layer such as a polysilicon layer. During an erase operation, the protrusions P may be blocked by using schottky barriers formed at junctions between the protrusions P and the pillar, thus improving the efficiency of the erase operation. In addition, during a program or read operation, ohmic contacts may be formed at the junctions between the protrusions P and the pillar to reduce resistance. Also, depletion regions in the protrusions P may be reduced to increase shielding effects. Accordingly, interference between neighboring memory cells may be reduced.

In another example, the protrusions P may comprise a polysilicon layer doped with impurities, and the channel layer CH may include a polysilicon layer not doped with impurities. The protrusions P doped with impurities may be used as junctions of the memory cells. For example, when the protrusions P are doped with P type impurities, a reverse junction may be formed during an erase operation to increase the efficiency of the erase operation. In addition, when the protrusions P are doped with N type impurities, resistance may be reduced during a read operation.

The channel layer CH may include at least one of a single crystalline silicon layer, a polycrystalline polysilicon layer, an amorphous silicon layer, a single crystalline germanium layer, a polycrystalline polygermanium layer, an amorphous germanium layer, a single crystalline silicon germanium layer, a polycrystalline polysilicon germanium layer, an amorphous silicon germanium layer, a metal layer, a silicide layer, a carbon nanotube, and graphene. The channel layer CH may be formed by epitaxial growth.

Figure 4B:
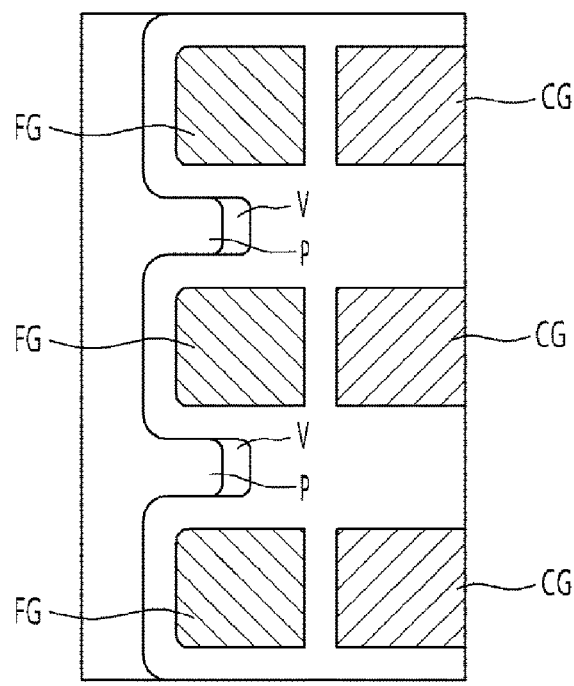

FIG. 4B is a cross-sectional view of a cell structure of a semiconductor device according to an embodiment of the present invention. As shown in FIG. 4B, the semiconductor device may have voids V formed between the stacked floating gates FG. Each of the voids V is filled with air and has a lower dielectric constant than an insulating layer. Thus, with the voids V formed between the stacked floating gates FG, interference between the floating gates FG may be reduced.

Figure 5:
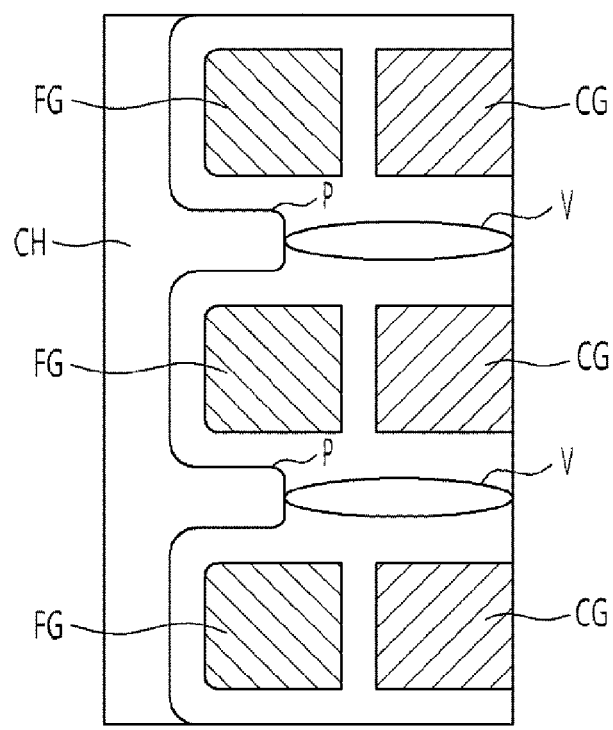
FIG. 5 is a cross-sectional view of a cell structure of a semiconductor device according to another embodiment of the present invention.

FIG. 5 is a cross-sectional view of a cell structure of a semiconductor device according to an embodiment of the present invention. As shown in FIG. 5, the semiconductor device may include the voids V that are formed between the floating gates FG and further extend between the stacked control gates CG. When the voids V further extend between the control gates CG, interference between the control gates CG as well as interference between the floating gates FG may be reduced.

FIGS. 6A and 6B and 7A and 7B are graphs illustrating the characteristics of a semiconductor device according to an embodiment of the present invention. FIG. 8 is a cross-sectional view of the characteristics of a semiconductor device according to an embodiment of the present invention.

Figure 6A:
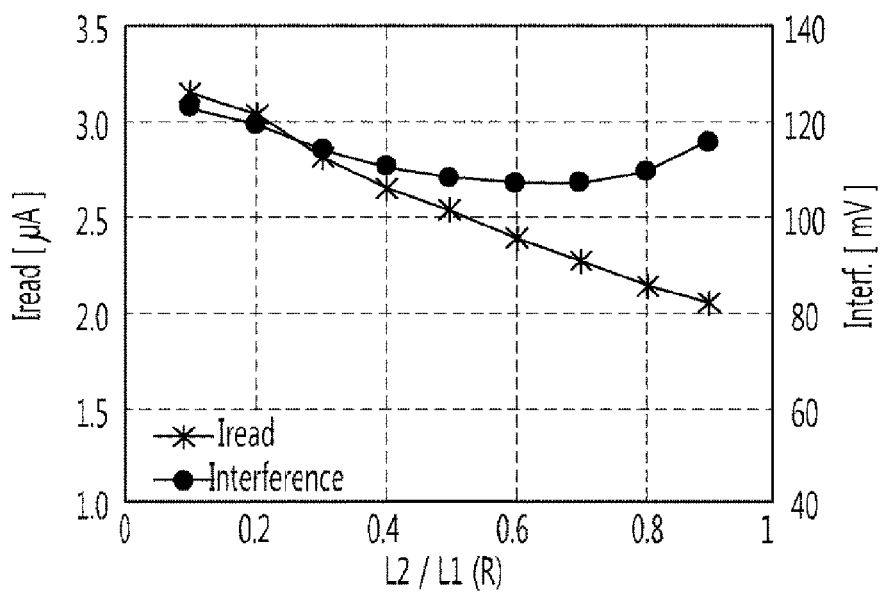
FIGS. 6A and 6B are graphs illustrating the characteristics of a semiconductor device according to an embodiment of the present invention.

FIG. 6A is a graph showing changes in Interference and read current Iread according to a ratio L2/L1 of the length L2 of the protrusion P overlapping with the floating gate FG to the length L1 of the floating gate FG. Here, the read current Iread is expressed in µA, and the Interference is expressed in mV. For reference, the Interference refers to a variation of a threshold voltage Vth of a selected memory cell in response to a change of a threshold voltage Vth of a neighboring memory cell. Thus, in the graph of FIG. 6A, the Interference is expressed by a value corresponding to the variation of the threshold voltage Vth of the selected memory cell when the threshold voltage Vth of the neighboring memory cell is changed by 1V.

In order for the protrusions P of the channel layer CH to reduce interference between the neighboring memory cells, the length L2 of each protrusion P (that is, the length L2 by which the protrusion P and the floating gate FG overlap with each other) is to be appropriately determined. In order to function as a barrier, the length L2 of each protrusion P may be increased. However in terms of structural properties of the channel layer CH, as the length L2 of each protrusion P increases it is more difficult to maintain a potential of the protrusion P the same as that of the pillar. Therefore as the ratio L2/L1 between the length L1 of the floating gate FG and the length L2 of the protrusion P increases, interference I1 (as illustrated in FIG. 8) may increase due to direct coupling between the floating gate FG and the protrusions P. In addition, an increase in resistance of the protrusions P may cause a reduction in the read current Iread.

On the other hand as the ratio L2/L1 between the length L1 of the floating gate FG and the length L2 of the protrusion P, the interference I2 (as illustrated in FIG. 8) may increase due to indirect coupling between the stacked floating gates FG. Therefore, the ratio L2/L1 between the length L1 of the floating gate FG and the length L2 of the protrusion P may be controlled to be within a range of between about 0.2 and 0.9, and in certain embodiments between about 0.4 and 0.8, so that interference between neighboring memory cells may be reduced, and the read current Iread may be improved.

Figure 6B:
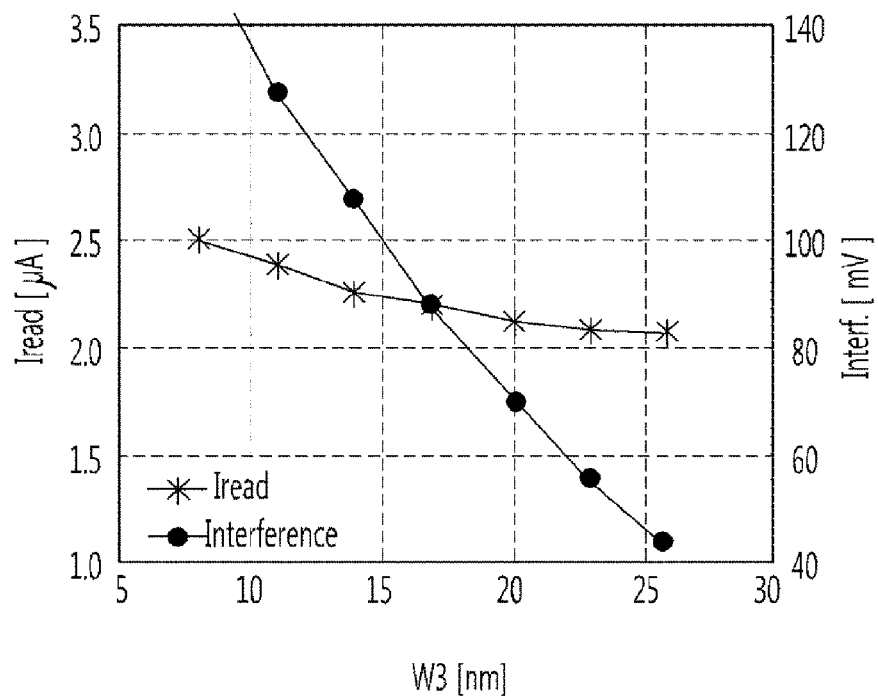

FIG. 6B is a graph showing changes in Interference and read current Iread according to the thickness W3 of the protrusion P.

As the thickness W3 of each protrusion P decreases, Interference may increase due to coupling effects between the neighboring floating gates FG. On the other hand, characteristics of the read current Iread may be deteriorated in proportion to the thickness W3 of the protrusion P. In other words as the thickness W3 of the protrusion P increases, resistance may increase, so that the read current Iread may be slightly reduced. Therefore, by maintaining the thickness W3 of the protrusion P at a predetermined level, interference effects between neighboring memory cells may be reduced without significant loss of the read current Iread.

Figure 7A:
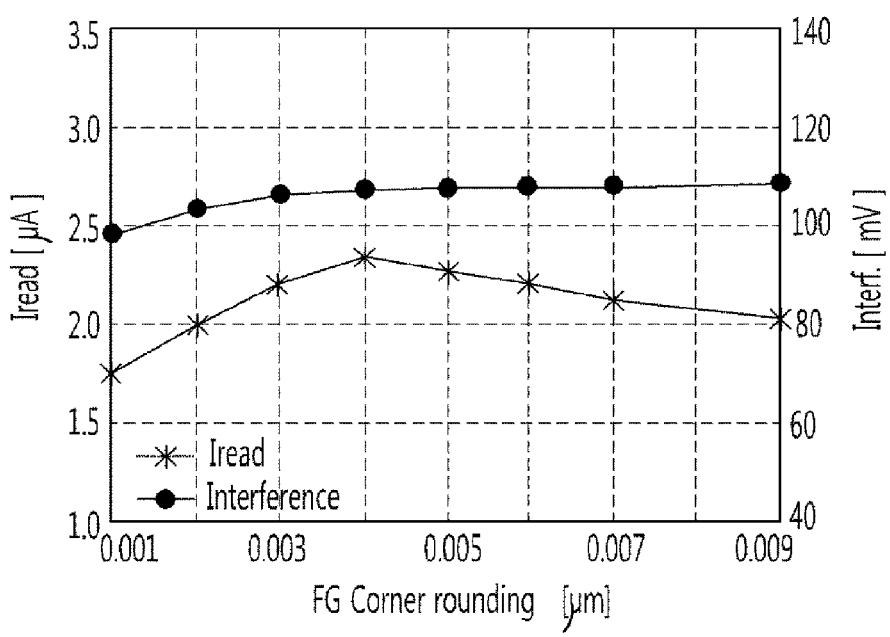
FIGS. 7A and 7B are graphs illustrating the characteristics of a semiconductor device according to an embodiment of the present invention.
Figure 8:
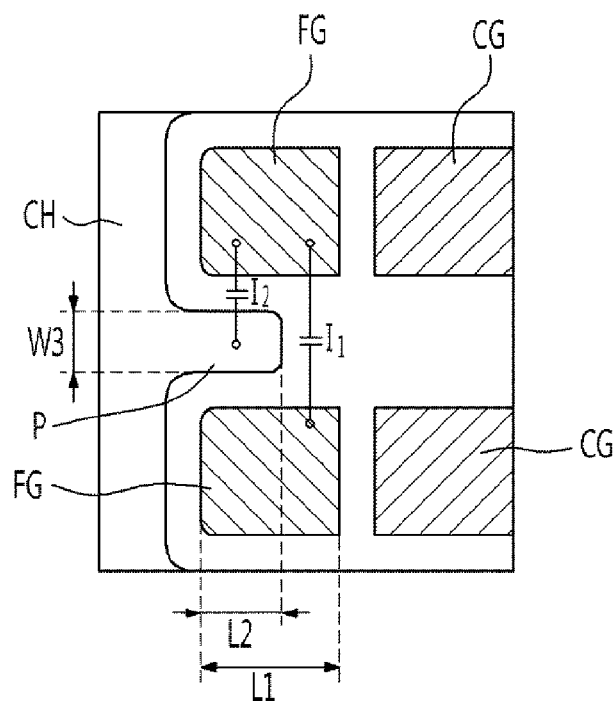
FIG. 8 is a cross-sectional view of a semiconductor device according to an embodiment of the present invention.

FIG. 7A is a graph illustrating changes in Interference and read current Iread, according to the curvature of the portions C of the corners of the floating gate FG. When the curvature of the portions C of the corners of the floating gate FG is reduced, an electric field may be dispersed to reduce the potential and electron density of the channel layer CH. Consequently, the read current Iread may be reduced. By controlling the radius of curvature of the portions C of the corners of the floating gate FG to be within a range of between about 0.002 and 0.009 µm, distribution of the read current Iread may be improved. When the radius of curvature of the portions C of the corners of the floating gate FG is 0.004 µm, optimal read current Iread may be secured.

Figure 7B:
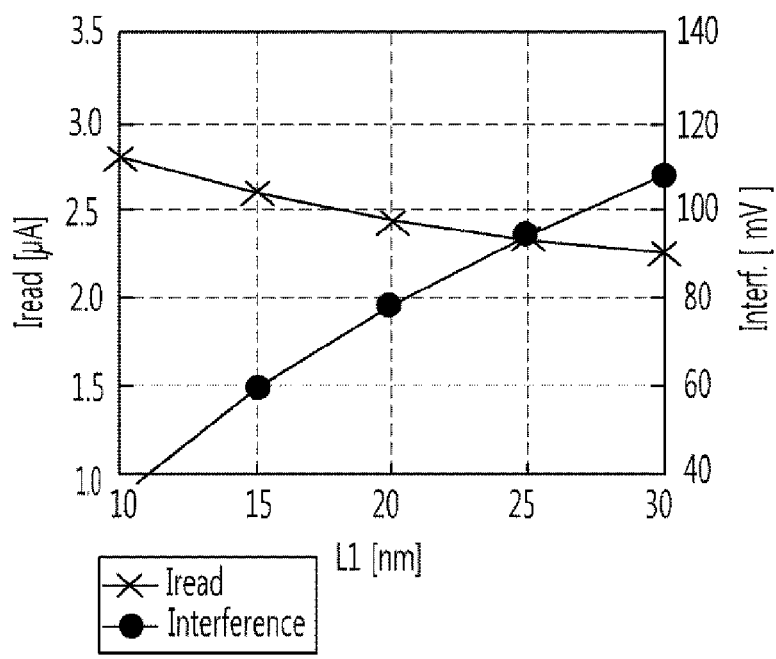

FIG. 7B is a graph illustrating changes in Interference and read current Iread according to the length L2 of the floating gate FG. When the length L1 of the floating gate FG is reduced, coupling capacitance between the neighboring floating gates FG may be suppressed to reduce interference effects.

In addition, since electron density of source and drain regions is increased by direct controllability of the control gate CG, characteristics of the read current Iread may also be improved. For example, by controlling the length L1 of the floating gate FG to be about 30 nm or less, and in certain embodiments to be about 15 nm or less, interference between neighboring memory cells may be reduced and the read current Iread may be improved.

FIGS. 9A to 9C and 10A to 10C are cross-sectional views illustrating a process flow for manufacturing a semiconductor device according to an embodiment of the present invention. For illustration purposes, a region in which a single memory cell is formed is enlarged.

Figure 9A:
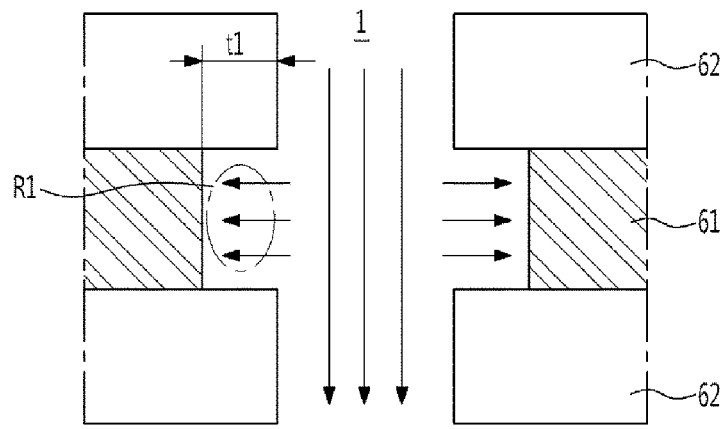
FIGS. 9A to 9C are cross-sectional views illustrating a process flow for manufacturing a semiconductor device.

As shown in FIG. 9A, first material layers 61 and second material layers 62 alternate with each other on a substrate (not shown) having a given lower structure. The first material layers 61 and the second material layers 62 may have substantially the same thickness as each other. The first material layers 61 are stacked to form floating gates 63 and control gates 67 as illustrated in FIG. 10C. The second material layers 62 are stacked to form interlayer insulating layers that separate the floating gates 63 and the control gates 67 from each other.

The first material layer 61 and the second material layer 62 may include materials having a high etch selectivity therebetween. For example, the first material layer 61 may include a conductive layer such as a polysilicon layer, and the second material layer 62 may include an insulating layer such as an oxide layer. In another example the first material layer 61 may include a conductive layer such as a doped polysilicon layer or a doped amorphous silicon layer, and the second material layer 62 may include a sacrificial layer such as an undoped polysilicon layer or an undoped amorphous silicon layer. In yet another example the first material layer 61 may include a sacrificial layer such as a nitride layer, and the second material layer 62 may include an insulating layer such as an oxide layer.

In this embodiment for example, the first material layer 61 may include a sacrificial layer, and the second material layer 62 may include an interlayer insulating layer.

Subsequently, as illustrated in FIG. 9A, the first material layers 61 and the second material layers 62 are etched in a longitudinal direction of FIG. 9A to form channel holes 1. For example, the channel holes 1 may be formed by an anisotropic etch process.

Subsequently, as illustrated in FIG. 9A, the first material layers 61 are etched by a first thickness t1 in a horizontal direction of FIG. 9 to form first recessed regions R1. The first recessed regions R1 are used to form the floating gates 63. The first recessed regions R1 are formed in consideration of a length L1 of each floating gate 63. For example, the first material layers 61 may be selectively etched by using an isotropic etch process under the condition that the first material layer 61 and the second material layer 62 include materials having a high etch selectivity therebetween.

Figure 9B:
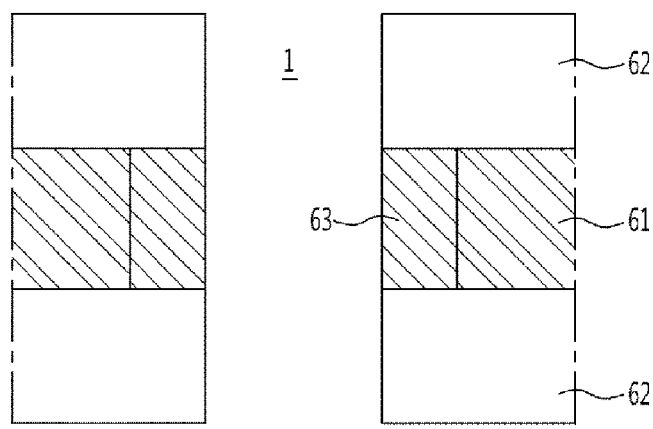

Next as shown in FIG. 9B the floating gates 63 are formed in the first recessed regions R1, respectively. For example, after the channel holes 1 are deposited with polysilicon layers so as to fill the first recessed regions R1, the polysilicon layers formed along inner walls of the channel holes 1 are etched by an anisotropic etch process to separate the floating gates 63 from each other.

Figure 9C:
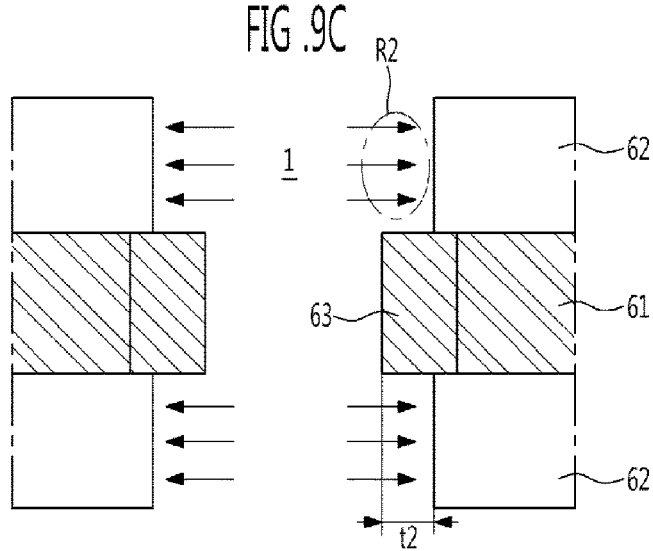

Subsequently, as shown in FIG. 9C, the second material layers 62 are etched by a second thickness t2 in a horizontal direction of FIG. 9C to form second recessed regions R2. The second recessed regions R2 are used to form protrusions 65a of a channel layer 65. In consideration of the thickness W3 of the protrusions 65a, the second recessed regions R2 are formed. For example, the second material layers 62 are selectively etched by using an isotropic etch process under the condition that the floating gates 63 and the second material layers 62 are formed of materials having a high etch selectivity therebetween. The first thickness t1 of the first recessed region R1 and the second thickness t2 of the second recessed region R2 may have the same or different values from each other, and the first thickness t1 of the first recessed region R1 may be greater than the second thickness t2 of the second recessed region R2. In order to form voids V between the floating gates 63 (see FIG. 4B), the second thickness t2 of the second recessed region R2 is determined in consideration of the length of the protrusions 65a and the size of the voids V.

Figure 10A:
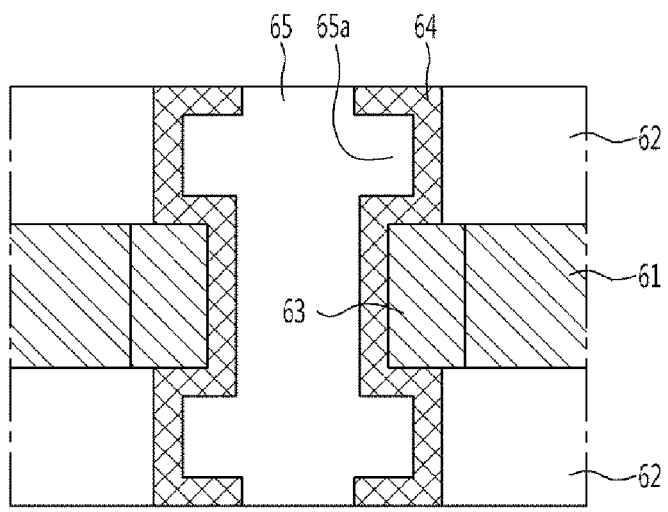
FIGS. 10A to 10C are cross-sectional views illustrating a process flow for manufacturing a semiconductor device according to an embodiment of the present invention.

As shown in FIG. 10A, a tunnel insulating layer 64 is formed along inner surfaces of the channel holes 1 having the second recessed regions R2 therein. Subsequently, the channel layer 65 is formed on the tunnel insulating layer 64. In this manner the channel layer 65 that has the same shape shown in FIG. 1 and includes a pillar (column) part protruding from the substrate SUB and the protrusions 65a protruding from the side of the pillar, is formed. Here, the voids V may be formed in the second recessed regions R2 by controlling the deposition conditions of the channel layer 65 (see FIG. 4B). For example when the channel layer 65 is formed by using a deposition process (deposition method) having low step coverage, the channel layer 65 may be first deposited at the opening rather than deep down in the second recessed region R2, so that the deep part of the second recessed region R2 may be left as an empty space in which the channel layer 65 is not deposited. In this manner, the voids V are formed between the floating gates 63 having substantially the same shape as those shown in FIG. 1 and stacked in the longitudinal direction of FIG. 10.

Figure 10B:
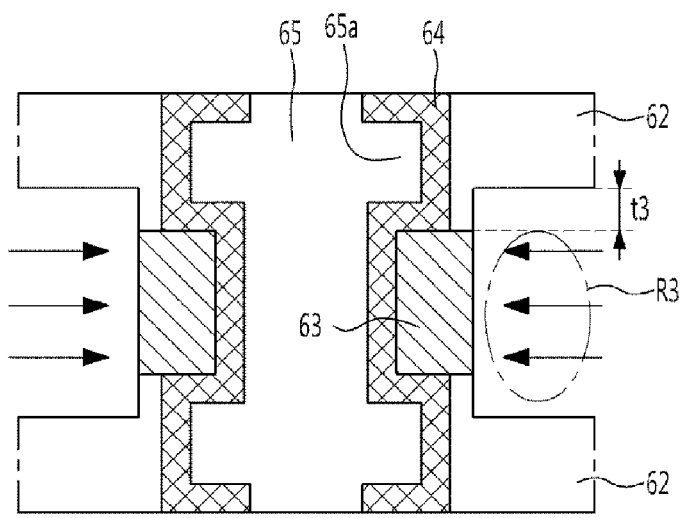
Figure 10C:
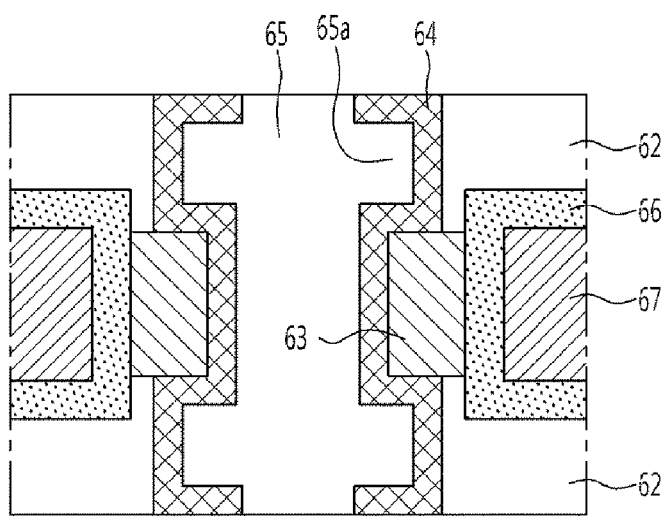

Next, as shown in FIG. 10B, the first material layers 61 and the second material layers 62 are etched to form slits (not shown) between the neighboring channel holes 1. The slits are formed to remove the first material layers 61 and are deep enough to expose the entirety of the first material layers 61. Subsequently, the first material layers 61 exposed by the slits are removed to form third recessed regions R3. The third recessed regions R3 are used to form a charge blocking layer 66 and control gates 67 as illustrated in FIG. 10C.

An etch process may be additionally performed to extend the third recessed regions R3. For example, the second material layers 62 may be partially etched by a predetermined thickness t3 by using an isotropic etch process. Here the second material layers 62 may be etched by a thickness of the charge blocking layer 66 that is to be formed by a subsequent process, so that the floating gates 63 and the control gates 67 may have the same thickness. Alternatively, the second material layers 62 may be partly etched by a thickness greater than the thickness of the charge blocking layer 66 so that the control gates may have a greater thickness than the floating gates 63.

As shown in FIG. 10C, the charge blocking layers 64 are formed along inner surfaces of the third recessed regions R3, and the control gates 67 are subsequently formed in the third recessed regions R3 having the charge blocking layer 64 formed thereon. For example, each of the control gates 67 may include a tungsten layer.

Though not shown in FIG. 10C, the second material layers 62 may be removed to form the voids V between the control gates 67 stacked in the longitudinal direction of FIG. 10C and having substantially the same shape shown in FIG. 5.

According to the above-described manufacturing method, it is possible to form the channel layer 65 having the protrusions 65a. Therefore, a semiconductor device having reduced interference between stacked memory cells may be provided.

The above-described manufacturing method may be changed depending on the types of the first material layers 61 and the second material layers 62. For example, when the first material layer 61 includes a conductive layer and the second material layer 62 includes an interlayer insulating layer, the charge blocking layer 66 may be formed along the inner surfaces of the second recessed regions R2 before the floating gates 63 are formed. In addition, after the slits are formed between the neighboring channel holes 1, the first material layer 61 may be silicided. In this case, processes of removing the first material layers 61 and forming the charge blocking layer 66 and the control gates 67 may not be performed.

In another example when the first material layer 61 includes a conductive layer, and the second material layer 62 includes a sacrificial layer, the charge blocking layer 66 may be formed along the inner surfaces of the second recessed regions R2 before the floating gates 63 are formed. In addition, after slits are formed between the neighboring channel holes 1, the first material layer 61 is silicided.

After the second material layers 62 are removed, spaces created by removing the second material layers 62 may be filled with an interlayer insulating layer. Here, these spaces may not be filled with the interlayer insulating layer but remain as the voids V. In this case, the processes of removing the first material layers 61 and forming the charge blocking layer 66 and the control gates 67 may not be performed.

Figure 11A:
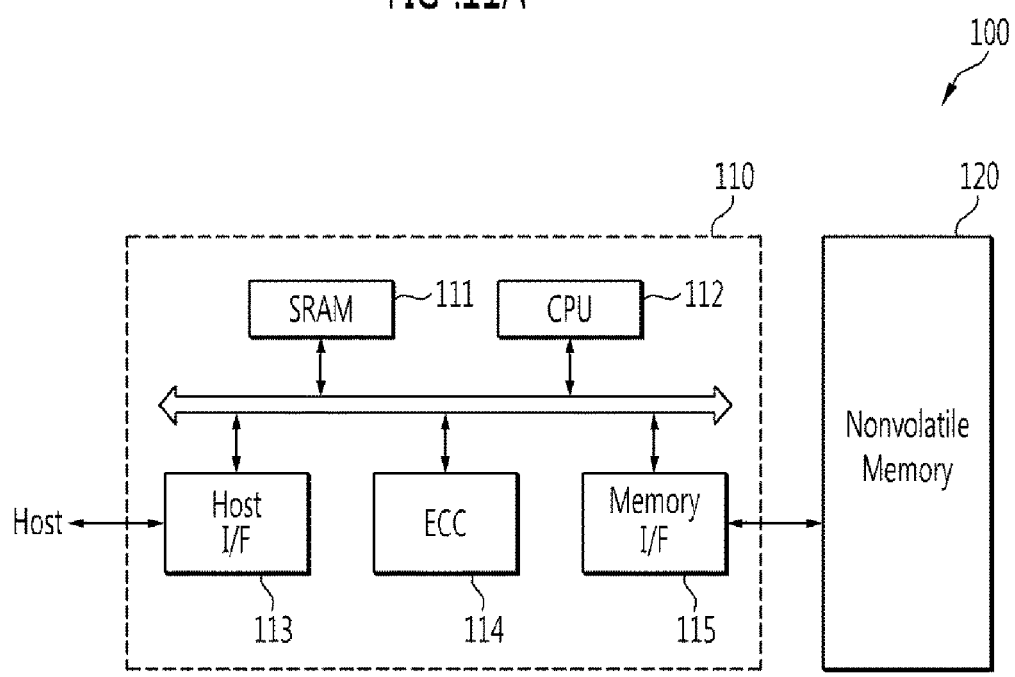
FIG. 11A is a block diagram showing the configuration of a memory system according to an embodiment of the present invention.

FIG. 11A is a view illustrating the configuration of a memory system according to an embodiment of the present invention. As shown in FIG. 11A, a memory system 100 according to an embodiment of the present invention includes a non-volatile memory device 120 and a memory controller 110.

The non-volatile memory device 120 is configured to have a cell array formed of the memory cells described in connection with FIGS. 1 to 10C. The non-volatile memory device 120 may be a multi-chip package formed of a plurality of flash memory chips.

The memory controller 110 is configured to control the non-volatile memory device 120, and may include a Static Random Access Memory (SRAM) 111, a Central Processing unit (CPU) 112, a host interface 113, an Error Correcting Code (ECC) 114, and a memory interface 115. The SRAM 111 is used as an operation memory of the CPU 112. The CPU 112 performs the general control operation for data exchange of the memory controller 110. The host interface 113 includes a data exchange protocol of a host being coupled to the memory system 100. In addition, the ECC 114 detects and corrects errors included in data read from the non-volatile memory device 120. The memory interface 115 performs an interface with the non-volatile memory device 120. The memory controller 110 may further include a Read Only Memory (ROM) that stores code data for an interface with the Host.

The memory system 100 having the above-described configuration may be a solid state disk (SSD) or a memory card in which the memory device 120 and the memory controller 110 are combined. For example, when the memory system 100 is an SSD, the memory controller 110 may communicate with the outside (e.g., a host) through one of the interface protocols including Universal Serial Bus (USB), MultiMedia Card (MMC), PCI-E, Serial ATA (SATA), Parallel ATA (PATA), Small Computer System Interface (SCSI), Enhanced Small Device Interface (ESDI) and Integrated Drive Electronics (IDE).

Figure 11B:
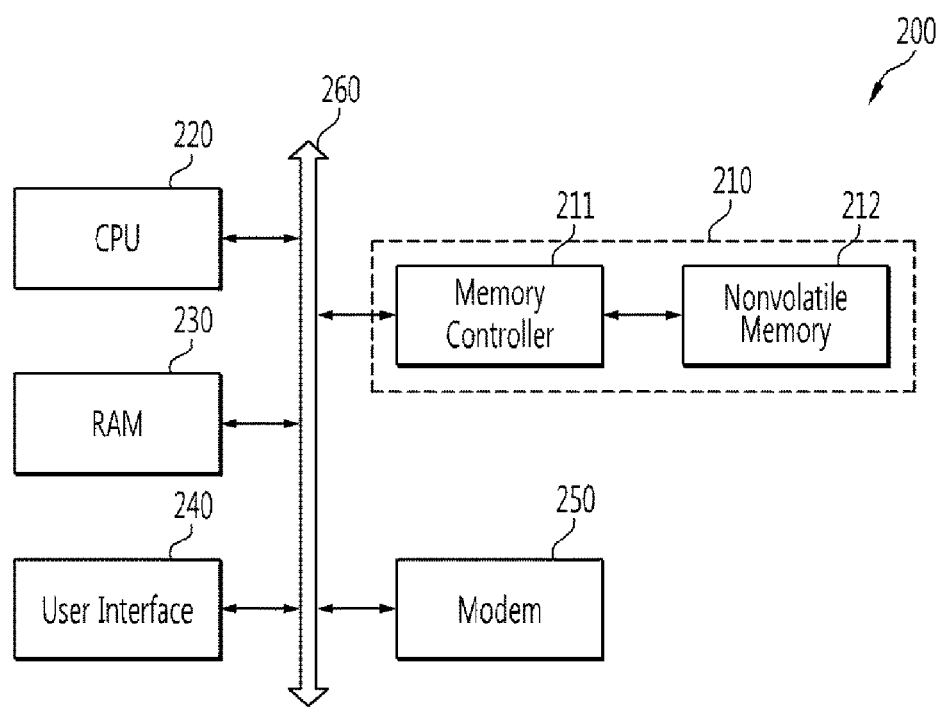
FIG. 11B is a block diagram showing the configuration of a computing system according to an embodiment of the present invention.

FIG. 11B is a view illustrating the configuration of a computing system according to an embodiment of the present invention. As shown in FIG. 11B, a computing system 200 according to an embodiment of the present invention may include a CPU 220, a Random Access Memory (RAM) 230, a user interface 240, a modem 250 and a memory system 210 that are electrically coupled to a system bus 260. In addition, when the computing system 200 is a mobile device, a battery may be further included to apply operating voltage to the computing system 200. The computing system 200 may further include application chipsets, a Camera Image Processor (CIS), and a mobile Dynamic Random Access Memory (DRAM).

As described above with reference to FIG. 11A, the memory system 210 may include a non-volatile memory 212 and a memory controller 211.

According to an embodiment of the present invention, a semiconductor device includes a channel layer protruding from a substrate and having protrusions extending from a sidewall thereof and floating gates surrounding the channel layer and formed between the protrusions. In particular, there is a level difference between the side of the floating gates and the side of the protrusions. Accordingly, the protrusions can reduce interference between the floating gates stacked one upon another.

What is claimed is:

1. A semiconductor device, comprising:
    a channel layer protruding from a substrate and having protrusions extending from a sidewall thereof and concaves provided between the protrusions;
    floating gates surrounding the channel layer and disposed in the concaves to be separate from each other;
    control gates surrounding the floating gates, respectively; and
    interlayer insulating layers surrounding the protrusions and interposed between the control gates,
    wherein a level difference exists between a lateral surface of each of the floating gates and a lateral surface of each of the protrusions.

2. The semiconductor device of claim 1, wherein the lateral surface of each floating gate protrudes further than the lateral surface of each protrusion.

3. The semiconductor device of claim 1, wherein the floating gates have different thicknesses from the control gates.

4. The semiconductor device of claim 1, wherein the channel layer includes a single crystalline silicon layer, a polycrystalline polysilicon layer, an amorphous silicon layer, a single crystalline germanium layer, a polycrystalline polygermanium layer, an amorphous germanium layer, a single crystalline silicon germanium layer, a polycrystalline polysilicon germanium layer, an amorphous silicon germanium layer, a metal layer, a silicide layer, a carbon nanotube, graphene, or a combination thereof.

5. The semiconductor device of claim 1, wherein the floating gates and the control gates each include a polycrystalline polysilicon layer, a metal layer, a silicide layer, a carbon tube, graphene, or a combination thereof.

6. The semiconductor device of claim 1, further comprising voids provided between the protrusions and the interlayer insulating layers and provided between the floating gates.

7. The semiconductor device of claim 1, further comprising voids provided in the interlayer insulating layers between the floating gates and further extending between the control gates.

8. The semiconductor device of claim 1, wherein each protrusion includes a metal layer, or a polysilicon layer doped with impurities.

9. The semiconductor device of claim 1, further comprising charge blocking layers interposed between the control gates and the floating gates and covering top and bottom surfaces of the control gates.

10. The semiconductor device of claim 1, further comprising a tunnel insulating layer surrounding the channel layer.

11. The semiconductor device of claim 1, wherein a length of each protrusion overlapping with each floating gate is between about 20 to 90% of a length of the floating gate.

12. The semiconductor device of claim 1, wherein portions of corners of the floating gates have a radius of curvature ranging from between about 0.002 to 0.009 μm.

13. The semiconductor device of claim 1, wherein each floating gate has a length of about 30 nm or less.

* * * * *